(12) United States Patent
Camacho et al.

(10) Patent No.: US 8,115,305 B2
(45) Date of Patent: Feb. 14, 2012

(54) INTEGRATED CIRCUIT PACKAGE SYSTEM WITH THIN PROFILE

(75) Inventors: Zigmund Ramirez Camacho, Singapore (SG); Henry Descalzo Bathan, Singapore (SG); Abelardo Hadap Advincula, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 1041 days.

(21) Appl. No.: 11/750,218

(22) Filed: May 17, 2007

(65) Prior Publication Data
US 2008/0284002 A1    Nov. 20, 2008

(51) Int. Cl.
*H01L 23/48* (2006.01)
*H01L 21/44* (2006.01)

(52) U.S. Cl. ........ 257/734; 257/773; 257/776; 257/790; 257/796; 438/26; 438/51; 438/55; 438/106; 438/125

(58) Field of Classification Search .......... 257/734, 257/773, 776, 790, 796; 438/26, 51, 55, 438/106, 125, 126, 127
See application file for complete search history.

(56) References Cited

U.S. PATENT DOCUMENTS

| | | | | |
|---|---|---|---|---|
| 5,474,958 | A * | 12/1995 | Djennas et al. | 29/827 |
| 5,639,694 | A * | 6/1997 | Diffenderfer et al. | 29/827 |
| 5,672,547 | A * | 9/1997 | Jeng et al. | 438/122 |
| 6,175,162 | B1 | 1/2001 | Kao et al. | |
| 6,307,256 | B1 | 10/2001 | Chiang et al. | |
| 6,348,729 | B1 * | 2/2002 | Li et al. | 257/691 |
| 6,674,159 | B1 | 1/2004 | Peterson et al. | |
| 6,723,585 | B1 | 4/2004 | Tu et al. | |
| 6,927,096 | B2 | 8/2005 | Shimanuki | |
| 7,542,294 | B2 * | 6/2009 | Caines et al. | 361/704 |
| 7,543,961 | B2 * | 6/2009 | Arik et al. | 362/294 |
| 2004/0027067 | A1 * | 2/2004 | Song et al. | 313/512 |

* cited by examiner

*Primary Examiner* — Thanh V Pham
(74) *Attorney, Agent, or Firm* — Mikio Ishimaru

(57) ABSTRACT

An integrated circuit package system is provided including attaching an external interconnect on a tape; attaching a backside element on the tape adjacent to the external interconnect; attaching an integrated circuit die with the backside element, the backside element is on a first passive side of the integrated circuit die; connecting a first active side of the integrated circuit die and the external interconnect; and forming a first encapsulation over the integrated circuit die with the backside element exposed.

20 Claims, 12 Drawing Sheets

INTEGRATED CIRCUIT PACKAGE SYSTEM WITH THIN PROFILE

TECHNICAL FIELD

The present invention relates generally to an integrated circuit package system and more particularly to an integrated circuit package system with backside element.

BACKGROUND ART

Across all sectors, industries, and geographies, demands continue for the electronic industry to provide products that are lighter, faster, smaller, multi-functional, more reliable, and more cost-effective. In order to meet these requirements of so many and varied consumers, more electrical circuits need to be more highly integrated to provide the functions demanded. Across virtually all applications, there continues to be growing demand for reducing size, increasing performance, and improving features of integrated circuits.

The seemingly endless requirements are no more visible than with products in our daily lives. Smaller and denser integrated circuits are required in many portable electronic products, such as cellular phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

Different challenges arise from increased functionality integration and miniaturization. Miniaturization also includes the thinness or profile thickness of the integrated circuit package. Conventional approaches for very thin integrated circuit package have hit yield and reliability problems. For example, in the efforts to form very thin packages, integrated circuits may be exposed from the encapsulation. This leads to damage to the integrated circuit, such as chipping or cracking.

Designers and manufactures also march towards functional integration as another popular approach to achieve miniaturization. However, the functional integration approaches have their own drawbacks and limitations. Often devices performing different functions are not integrated into a single integrated circuit for a number of reasons, such as incompatible technologies or for lower cost. Conventional packaging of disparate devices results in packages having undesirably large form factor or size.

Thus, a need still remains for an integrated circuit package system providing low cost manufacturing, improved yield, device integration, and small form factor for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including attaching an external interconnect on a tape; attaching a backside element on the tape adjacent to the external interconnect; attaching an integrated circuit die with the backside element, the backside element is on a first passive side of the integrated circuit die; connecting a first active side of the integrated circuit die and the external interconnect; and forming a first encapsulation over the integrated circuit die with the backside element exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
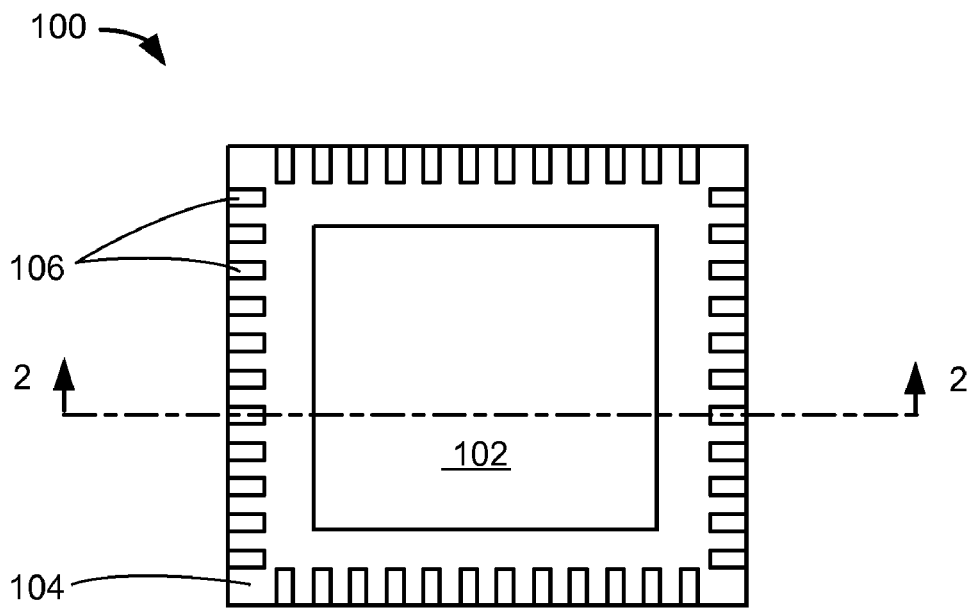
FIG. 1 is a bottom view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in a first embodiment of the present invention. The bottom view depicts a backside element 102 surrounded by an encapsulation 104, such as an epoxy mold compound. External interconnects 106, such as leads, are along the peripheral border of the integrated circuit package system 100. The encapsulation 104 is between the external interconnects 106. For illustrative purposes, the integrated circuit package system 100 is shown having a single row of the external interconnects 106, although it is understood that the integrated circuit package system 100 may have more than one row of the external interconnects 106.

The backside element 102 may be a number of different materials. For example, the backside element 102 may include a plastic layer having cured properties of the encapsulation 104. The plastic layer may be formed in a number of different ways, such as screen printed and cured epoxy paste.

Another example, the backside element 102 may include a polymer film, such as a B-stage adhesive film, an elastomer film, a polycarbonate, or acrylonitrile-butadiene-styrene (ABS). The polymer film may be formed in a number of different ways, such as a laminated layer. Yet another example, the backside element 102 may include an epoxy mold compound, such as a pre-mold having silica filled epoxy molding compound with similar cured properties to the encapsulation 104.

Figure 2:
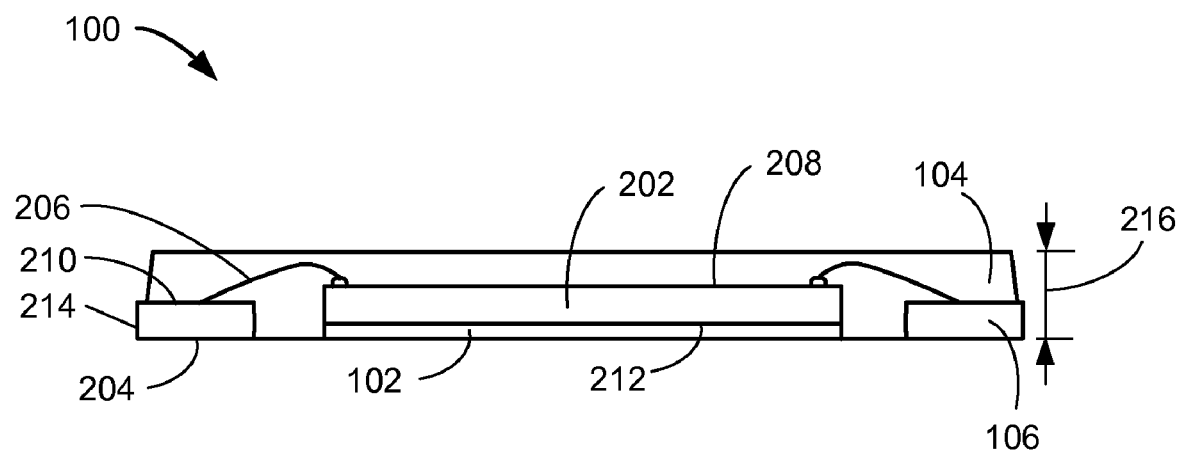
FIG. 2 is a cross-sectional view of the integrated circuit package system of FIG. 1 along line 2-2.

Referring now to FIG. 2, therein is shown a cross-sectional view of the integrated circuit package system 100 of FIG. 1 along line 2-2. The cross-sectional view depicts an integrated circuit die 202 over the backside element 102. The encapsulation 104 exposes the backside element 102 and a first side 204 of the external interconnects 106 to ambient. The backside element 102, the first side 204, and the encapsulation 104 in between are preferably shown as substantially coplanar along a plane having the first side 204.

Internal interconnects 206, such as bond wires, ribbon bond wires, reversed-stand-off-stitch bonding (RSSB) or planar electrical interconnects, preferably connect a first active side 208 of the integrated circuit die 202 and a second side 210 of the external interconnects 106. The first active side 208 has active circuitry fabricated thereon. The encapsulation 104 covers the integrated circuit die 202 and the internal interconnects 206. The backside element 102 covers a first passive side 212 of the integrated circuit die 202. The encapsulation 104 partially covers the backside element 102 and the external interconnects 106. The encapsulation 104 preferably exposes a peripheral side 214 of the external interconnects 106 as well as the first side 204.

The integrated circuit package system 100 has a package thickness 216 from the first side 204 to a side of the encapsulation 104 opposing a side coplanar with the first side 204. The backside element 102 protects the integrated circuit die 202 from chipping, cracking, or breaking and provides planar rigidity. The backside element 102 protects the integrated circuit die 202 from the environment, such as moisture.

The integrated circuit package system 100 may be formed by a number of different ways to a predetermined height for the package thickness 216. For example, the backside element 102 protects the integrated circuit die 202 allowing aggressive thinning of the integrated circuit die 202. The external interconnects 106 may be formed to predetermined thickness. Different types of the internal interconnects 206 may be used to provide a predetermined value of the package thickness 216. The backside element 102 may be formed from different materials or different thickness.

Figure 3:
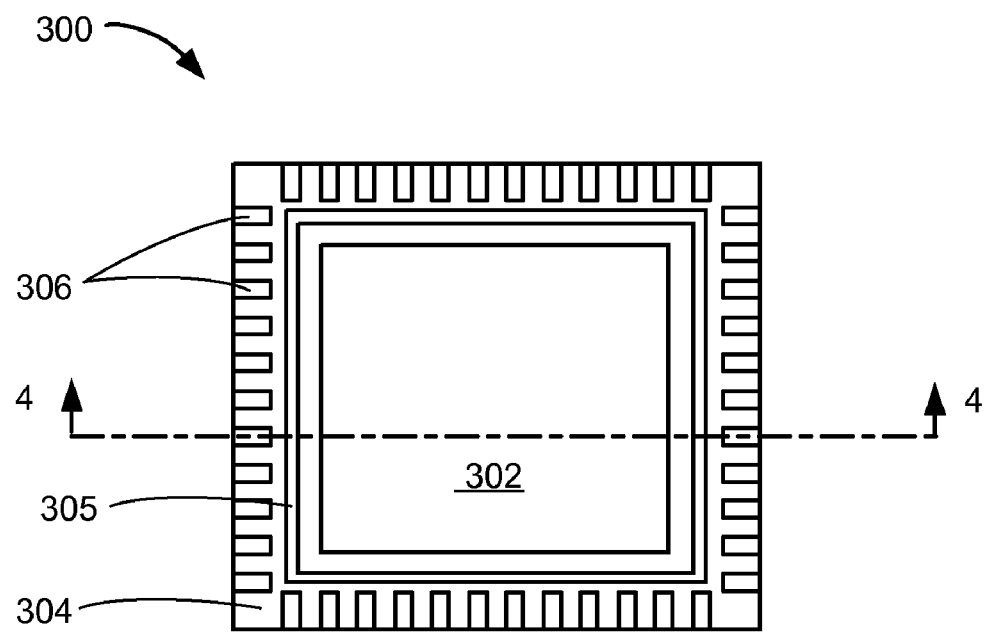
FIG. 3 is a bottom view of an integrated circuit package system in a second embodiment of the present invention.

Referring now to FIG. 3, therein is shown a bottom view of an integrated circuit package system 300 in a second embodiment of the present invention. The bottom view depicts a backside element 302 surrounded by an encapsulation 304, such as an epoxy mold compound. The encapsulation 304 also surrounds a ring 305, such as a ground ring, wherein the ring 305 surrounds the backside element 302. The backside element 302 is isolated from external interconnects 306, such as leads, are along the peripheral border of the integrated circuit package system 300. The encapsulation 304 is between the external interconnects 306. For illustrative purposes, the integrated circuit package system 300 is shown having a single row of the external interconnects 306, although it is understood that the integrated circuit package system 300 may have more than one row of the external interconnects 306.

The backside element 302 may be a number of different materials. For example, the backside element 302 may include a plastic layer having cured properties of the encapsulation 304. The backside element 302 may be formed in a number of different ways, such as screen printed and cured epoxy paste.

Another example, the backside element 302 may include a polymer film, such as a B-stage adhesive film, an elastomer film, a polycarbonate, or acrylonitrile-butadiene-styrene (ABS). The polymer film may be formed in a number of different ways, such as a laminated layer. Yet another example, the backside element 302 may include an epoxy mold compound, such as a pre-mold having silica filled epoxy molding compound with similar cured properties to the encapsulation 304.

Figure 4:
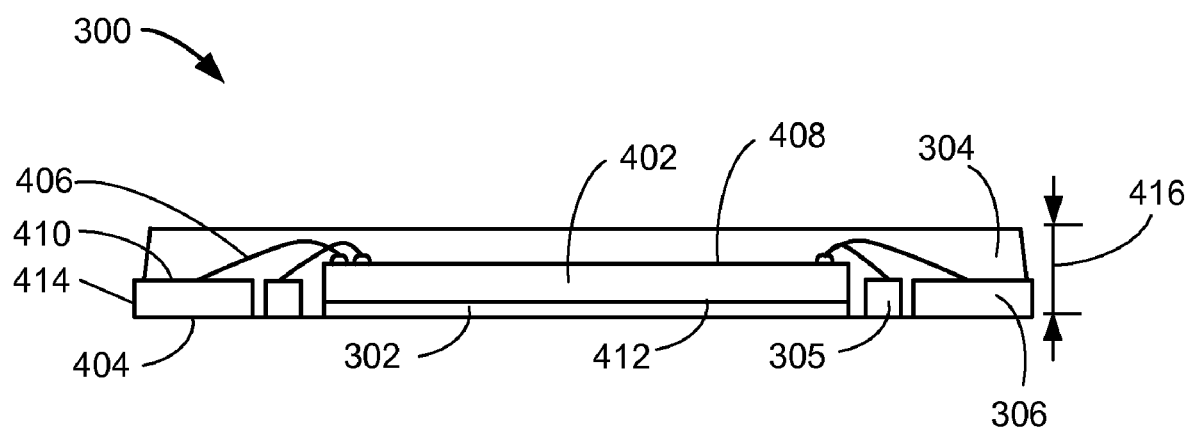
FIG. 4 is a cross-sectional view of the integrated circuit package system of FIG. 3 along line 4-4.

Referring now to FIG. 4, therein is shown a cross-sectional view of the integrated circuit package system 300 of FIG. 3 along line 4-4. The cross-sectional view depicts an integrated circuit die 402 over the backside element 302. The encapsulation 304 exposes the backside element 302, the ring 305, and a first side 404 of the external interconnects 306 to ambient. The backside element 302, the first side 404, the ring 305, and the encapsulation 304 are preferably shown as substantially coplanar along a plane having the first side 404. For illustrative purposes, the encapsulation 304 is shown exposing the ring 305, although it is understood that the ring 305 may not be exposed by the encapsulation 304.

Internal interconnects 406, such as bond wires, ribbon bond wires, reversed-stand-off-stitch bonding (RSSB) or planar electrical interconnects, preferably connect a first active side 408 of the integrated circuit die 402 and a second side 410 of the external interconnects 306. The first active side 408 has active circuitry fabricated thereon. The internal interconnects 406 also preferably connect the first active side 408 and the ring 305.

The encapsulation 304 covers the integrated circuit die 402, the ring 305, and the internal interconnects 406. The backside element 302 covers a first passive side 412 of the integrated circuit die 402. The encapsulation 304 partially covers the backside element 302 and the external interconnects 306. The encapsulation 304 preferably exposes a peripheral side 414 of the external interconnects 306 as well as the first side 404.

The integrated circuit package system 300 has a package thickness 416 from the first side 404 to a side of the encapsulation 304 opposing a side coplanar with the first side 404. The backside element 302 protects the integrated circuit die 402 from chipping, cracking, or breaking and provides planar rigidity. The backside element 302 protects the integrated circuit die 402 from the environment, such as moisture.

The integrated circuit package system 300 may be formed by a number of different ways to a predetermined height for the package thickness 416. For example, the backside element 302 protects the integrated circuit die 402 allowing aggressive thinning of the integrated circuit die 402. The external interconnects 306 and the ring 305 may be thinned to predetermined thickness. Different types of the internal interconnects 406 may be used to provide a predetermined value of the package thickness 416. The backside element 302 may be formed from different materials or different thickness.

Figure 5:
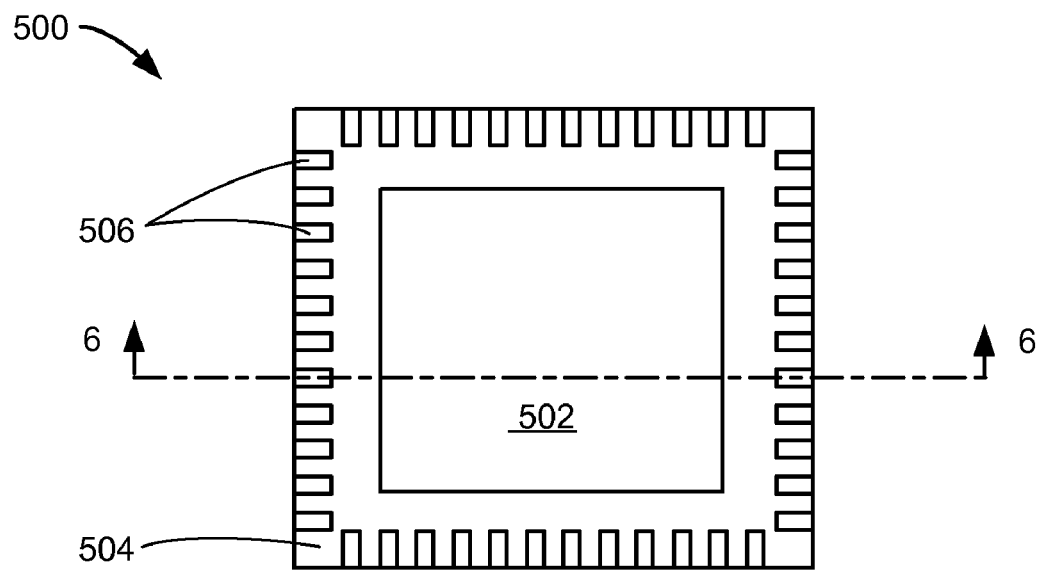
FIG. 5 is a bottom view of an integrated circuit package system in a third embodiment of the present invention.

Referring now to FIG. 5, therein is shown a bottom view of an integrated circuit package system 500 in a third embodiment of the present invention. The bottom view depicts a backside element 502 surrounded by an encapsulation 504, such as an epoxy mold compound. External interconnects 506, such as leads, are along the peripheral border of the integrated circuit package system 500. The encapsulation 504 is between the external interconnects 506. For illustrative purposes, the integrated circuit package system 500 is shown having a single row of the external interconnects 506, although it is understood that the integrated circuit package system 500 may have more than one row of the external interconnects 506.

The backside element 502 may be a number of different materials. For example, the backside element 502 may include a plastic layer having cured properties of the encapsulation 504. The backside element 502 may be formed in a number of different ways, such as screen printed and cured epoxy paste.

Another example, the backside element 502 may include a polymer film, such as a B-stage adhesive film, an elastomer film, a polycarbonate, or acrylonitrile-butadiene-styrene (ABS). The polymer film may be formed in a number of different ways, such as a laminated layer. Yet another example, the backside element 502 may include an epoxy mold compound, such as a pre-mold having silica filled epoxy molding compound with similar cured properties to the encapsulation 504.

Figure 6:
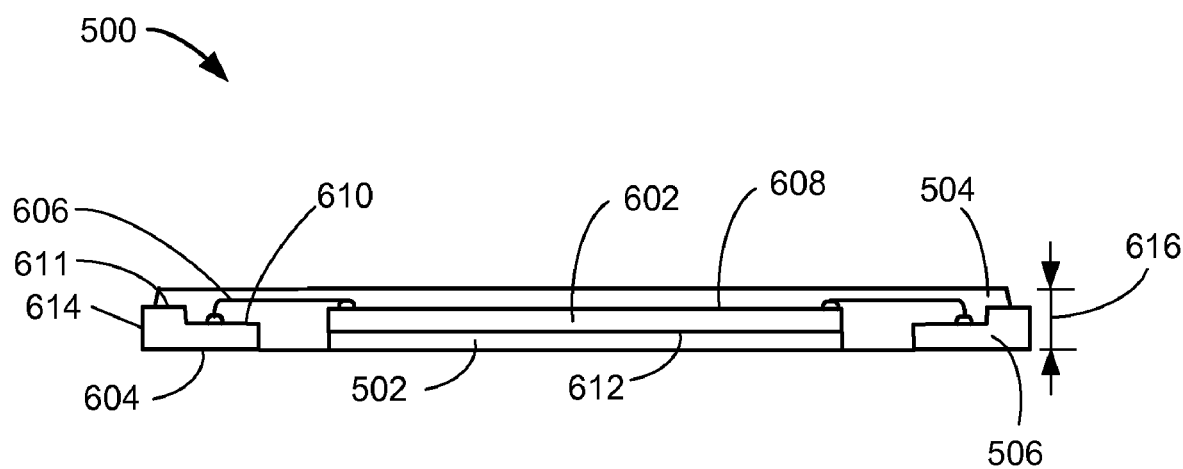
FIG. 6 is a cross-sectional view of the integrated circuit package system of FIG. 5 along line 6-6.

Referring now to FIG. 6, therein is shown a cross-sectional view of the integrated circuit package system 500 of FIG. 5 along line 6-6. The cross-sectional view depicts an integrated circuit die 602 over the backside element 502. The encapsulation 504 exposes the backside element 502 and a first side 604 of the external interconnects 506 to ambient. The backside element 502, the first side 604, and the encapsulation 504 in between are preferably shown as substantially coplanar along a plane having the first side 604.

Internal interconnects 606, such as bond wires, ribbon bond wires, reversed-stand-off-stitch bonding (RSSB) or planar electrical interconnects, preferably connect a first active side 608 of the integrated circuit die 602 and a second side 610 of the external interconnects 506. The first active side 608 has active circuitry fabricated thereon. The external interconnects 506 have an L-shaped or half-etched configuration with the second side 610 is lower than a third side 611 of the external interconnects 506, wherein the second side 610 and the third side 611 are opposing sides to the first side 604.

The encapsulation 504 covers the integrated circuit die 602, the internal interconnects 606, and the second side 610. The backside element 502 covers a first passive side 612 of the integrated circuit die 602. The encapsulation 504 partially covers the backside element 502 and the external interconnects 506. The encapsulation 504 preferably exposes a peripheral side 614 of the external interconnects 506 as well as the first side 604. The encapsulation 504 is shown partially exposing the third side 611. For illustrative purposes, the encapsulation 504 is shown partially exposing the third side 611, although it is understood that the encapsulation 504 may fully expose or fully cover the third side 611.

The integrated circuit package system 500 has a package thickness 616 from the first side 604 to a side of the encapsulation 504 opposing a side coplanar with the first side 604. The backside element 502 protects the integrated circuit die 602 from chipping, cracking, or breaking and provides planar rigidity. The backside element 502 protects the integrated circuit die 602 from the environment, such as moisture.

The integrated circuit package system 500 may be formed by a number of different ways to a predetermined height for the package thickness 616. For example, the backside element 502 protects the integrated circuit die 602 allowing aggressive thinning of the integrated circuit die 602. The external interconnects 506 may be formed to predetermined thickness. Different types of the internal interconnects 606 may be used to provide a predetermined value of the package thickness 616. The backside element 502 may be formed from different materials or different thickness.

Figure 7:
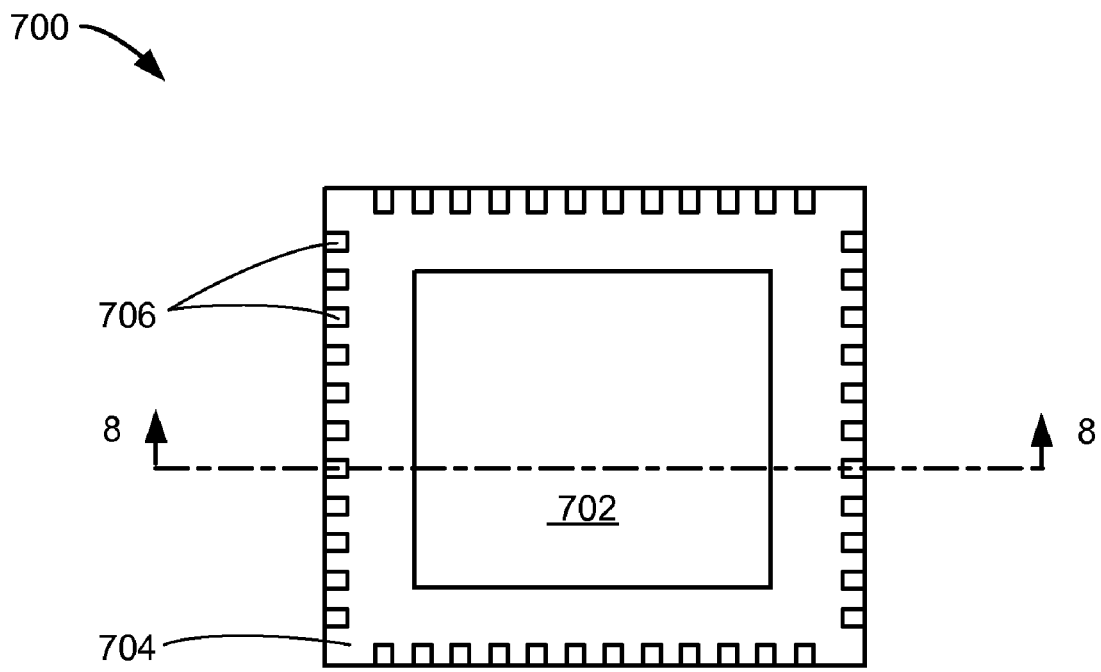
FIG. 7 is a bottom view of an integrated circuit package system in a fourth embodiment of the present invention.

Referring now to FIG. 7, therein is shown a bottom view of an integrated circuit package system 700 in a fourth embodiment of the present invention. The bottom view depicts a backside element 702 surrounded by an encapsulation 704, such as an epoxy mold compound. External interconnects 706, such as leads, are along the peripheral border of the integrated circuit package system 700. The encapsulation 704 is between the external interconnects 706. For illustrative purposes, the integrated circuit package system 700 is shown having a single row of the external interconnects 706, although it is understood that the integrated circuit package system 700 may have more than one row of the external interconnects 706.

The backside element 702 may be a number of different materials. For example, the backside element 702 may include a plastic layer having cured properties of the encapsulation 704. The backside element 702 may be formed in a number of different ways, such as screen printed and cured epoxy paste.

Another example, the backside element 702 may include a polymer film, such as a B-stage adhesive film, an elastomer film, a polycarbonate, or acrylonitrile-butadiene-styrene (ABS). The polymer film may be formed in a number of different ways, such as a laminated layer. Yet another example, the backside element 702 may include an epoxy mold compound, such as a pre-mold having silica filled epoxy molding compound with similar cured properties to the encapsulation 704.

Figure 8:
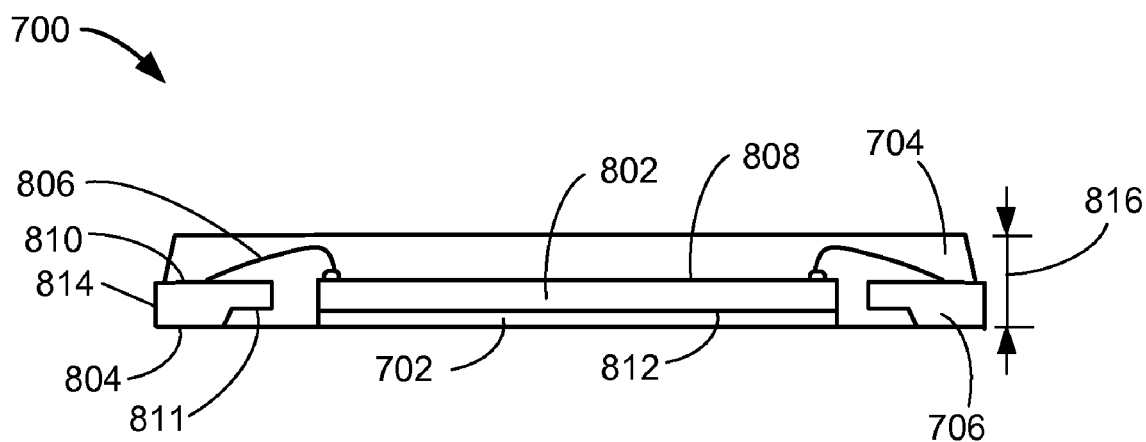
FIG. 8 is a cross-sectional view of the integrated circuit package system of FIG. 7 along line 8-8.

Referring now to FIG. 8, therein is shown a cross-sectional view of the integrated circuit package system 700 of FIG. 7 along line 8-8. The cross-sectional view depicts an integrated circuit die 802 over the backside element 702. The encapsulation 704 exposes the backside element 702 and a first side 804 of the external interconnects 706 to ambient. The backside element 702, the first side 804, and the encapsulation 704 in between are preferably shown as substantially coplanar along a plane having the first side 804.

Internal interconnects 806, such as bond wires, ribbon bond wires, reversed-stand-off-stitch bonding (RSSB) or planar electrical interconnects, preferably connect a first active side 808 of the integrated circuit die 802 and a second side 810 of the external interconnects 706. The first active side 808 has active circuitry fabricated thereon. The external interconnects 706 have a half-etched configuration with the first side 804 is lower than a third side 811 of the external interconnects 706, wherein the first side 804 and the third side 811 are opposing sides to the second side 810.

The encapsulation 704 covers the integrated circuit die 802, the internal interconnects 806, and the third side 811. The backside element 702 covers a first passive side 812 of the integrated circuit die 802. The encapsulation 704 partially covers the backside element 702 and the external interconnects 706. The encapsulation 704 preferably exposes a peripheral side 814 of the external interconnects 706 as well as the first side 804. The encapsulation 704 is shown partially exposing the second side 810. For illustrative purposes, the encapsulation 704 is shown partially exposing the second side 810, although it is understood that the encapsulation 704 may fully cover the second side 810.

The integrated circuit package system 700 has a package thickness 816 from the first side 804 to a side of the encapsulation 704 opposing a side coplanar with the first side 804. The backside element 702 protects the integrated circuit die 802 from chipping, cracking, or breaking and provides planar rigidity. The backside element 702 protects the integrated circuit die 802 from the environment, such as moisture.

The integrated circuit package system 700 may be formed by a number of different ways to a predetermined height for the package thickness 816. For example, the backside element 702 protects the integrated circuit die 802 allowing aggressive thinning of the integrated circuit die 802. The external interconnects 706 may be formed to predetermined thickness. Different types of the internal interconnects 806 may be used to provide a predetermined value of the package thickness 816. The backside element 702 may be formed from different materials or different thickness.

Figure 9:
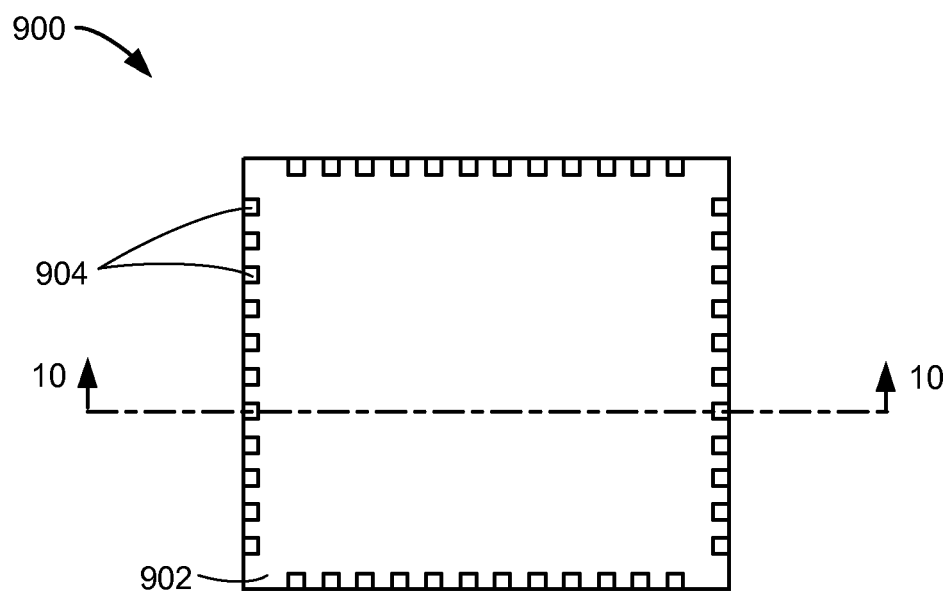
FIG. 9 is a bottom view of an integrated circuit package system in a fifth embodiment of the present invention.

Referring now to FIG. 9, therein is shown a bottom view of an integrated circuit package system 900 in a fifth embodiment of the present invention. The bottom view depicts a first encapsulation 902, such as an epoxy mold compound, between external interconnects 904, such as leads. For illustrative purposes, the integrated circuit package system 900 is shown with a single row of the external interconnects 904, although it is understood that the integrated circuit package system 900 may have more than one row of the external interconnects 904.

Figure 10:
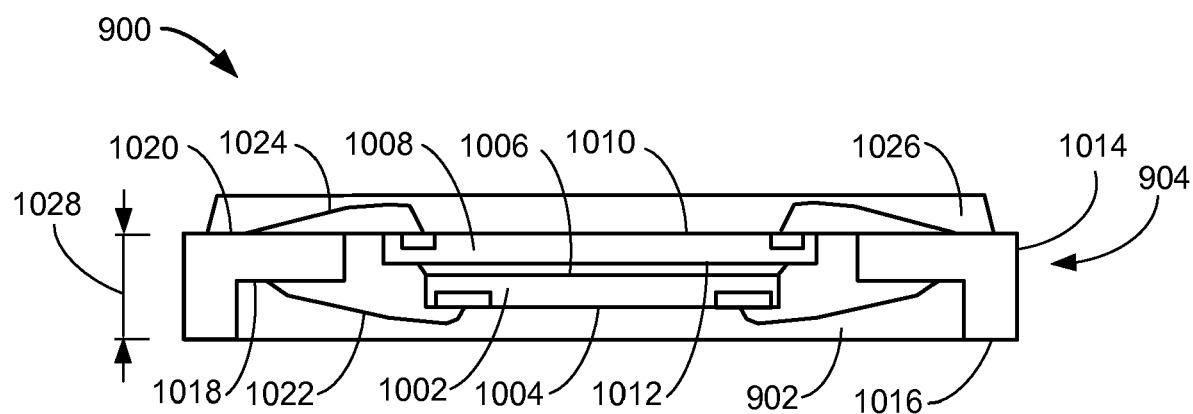
FIG. 10 is a cross-sectional view of the integrated circuit package system of FIG. 9 along line 10-10.

Referring now to FIG. 10, therein is shown a cross-sectional view of the integrated circuit package system 900 of FIG. 9 along line 10-10. The cross-sectional view depicts an integrated circuit die 1002 having a first active side 1004 and a first passive side 1006. The first active side 1004 has active circuitry fabricated thereon. The first passive side 1006 faces a backside element 1008, such as another integrated circuit die. The backside element 1008 has a second active side 1010 and a second passive side 1012. The integrated circuit die 1002 and the backside element 1008 are attached to each other in a back-to-back configuration with the first passive side 1006 facing the second passive side 1012.

The external interconnects 904 includes a peripheral side 1014, a first side 1016, a second side 1018, and a third side 1020. The peripheral side 1014 help forms the outermost peripheral border of the integrated circuit package system 900. The external interconnects 904 is along the height of the first encapsulation 902. The first encapsulation 902 exposes the first side 1016, wherein the first side 1016 is below the second side 1018.

The external interconnects 904 may be formed by a number of different ways. For example, the second side 1018 may be formed by half-etching from the first side 1016. Another example, the external interconnects 904 may be formed by stamping or punching the external interconnects 904 for forming the L-shaped configuration of the external interconnects 904. The third side 1020 is at an opposing side of the external interconnects 904 to the first side 1016 and the second side 1018.

First internal interconnects 1022, such as bond wires, ribbon bond wires, reversed-stand-off-stitch bonding (RSSB) or planar electrical interconnects, connect the first active side 1004 and the second side 1018 of a portion of the external interconnects 904. Second internal interconnects 1024, such as bond wires, ribbon bond wires, reversed-stand-off-stitch bonding (RSSB) or planar electrical interconnects, connect the second active side 1010 and the third side 1020 of a portion of the external interconnects 904. For illustrative purposes, the first internal interconnects 1022 and the second internal interconnects 1024 are shown connecting the same instances of the external interconnects 904, although it is understood that the first internal interconnects 1022 and the second internal interconnects 1024 may not connect to the same instances of the external interconnects 904.

The first encapsulation 902 covers the integrated circuit die 1002 and the first internal interconnects 1022. The first encapsulation 902 partially covers the external interconnects 904 and the backside element 1008. The first encapsulation 902 is coplanar with the external interconnects 904 along a plane having the first side 1016. The first encapsulation 902 exposes the second active side 1010 of the backside element 1008.

A second encapsulation 1026, such as an epoxy mold compound, is over the first encapsulation 902 and the external interconnects 904 covering the second active side 1010 of the backside element 1008 and the second internal interconnects 1024. The second encapsulation 1026 partially covers the third side 1020 with a portion of the third side 1020 that is adjacent to the peripheral side 1014 is exposed.

The integrated circuit package system 900 has a number of features providing a package height 1028 having a low profile, wherein the package height 1028 is similar to or substantially the same as conventional single die packages (not shown). For example, the back-to-back mounting configuration and the dual molded body are examples of these features providing a predetermined low profile for the package height 1028.

The integrated circuit package system 900 may be formed by a number of different ways to a predetermined height for the package height 1028. For example, the backside element 1008, the integrated circuit die 1002, or a combination thereof may be aggressive thinned. The external interconnects 904 may be formed to predetermined thickness. Different types of the first internal interconnects 1022 and the second internal interconnects 1024 may be used to provide a predetermined value of the package height 1028.

Figure 11:
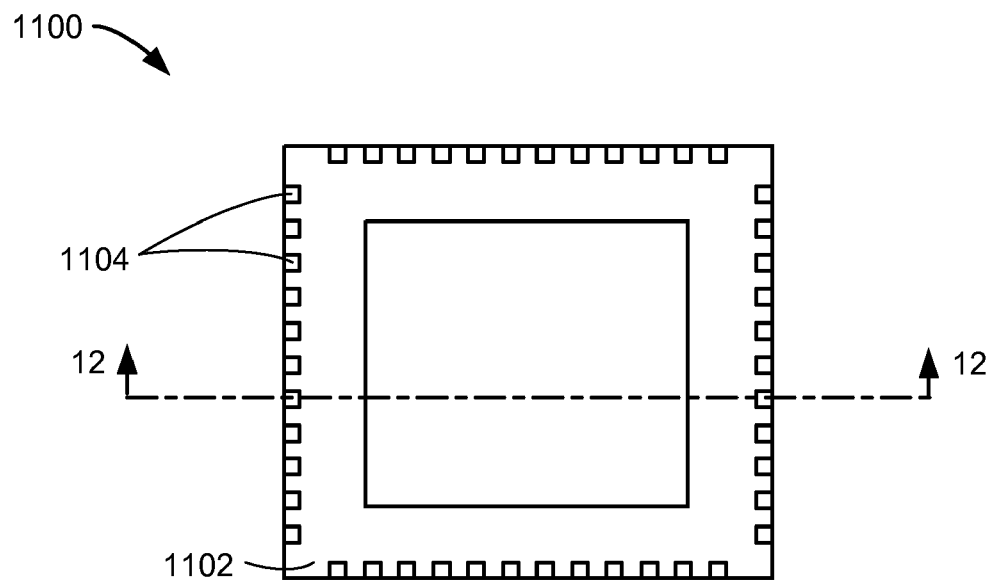
FIG. 11 is a bottom view of an integrated circuit package system in a sixth embodiment of the present invention.

Referring now to FIG. 11, therein is shown a bottom view of an integrated circuit package system 1100 in a sixth embodiment of the present invention. The integrated circuit package system 1100 has similar structures to the integrated circuit package system 900 of FIG. 9.

The bottom view depicts a first encapsulation 1102, such as an epoxy mold compound, between external interconnects 1104, such as leads. For illustrative purposes, the integrated circuit package system 1100 is shown with a single row of the external interconnects 1104, although it is understood that the integrated circuit package system 1100 may have more than one row of the external interconnects 1104.

Figure 12:
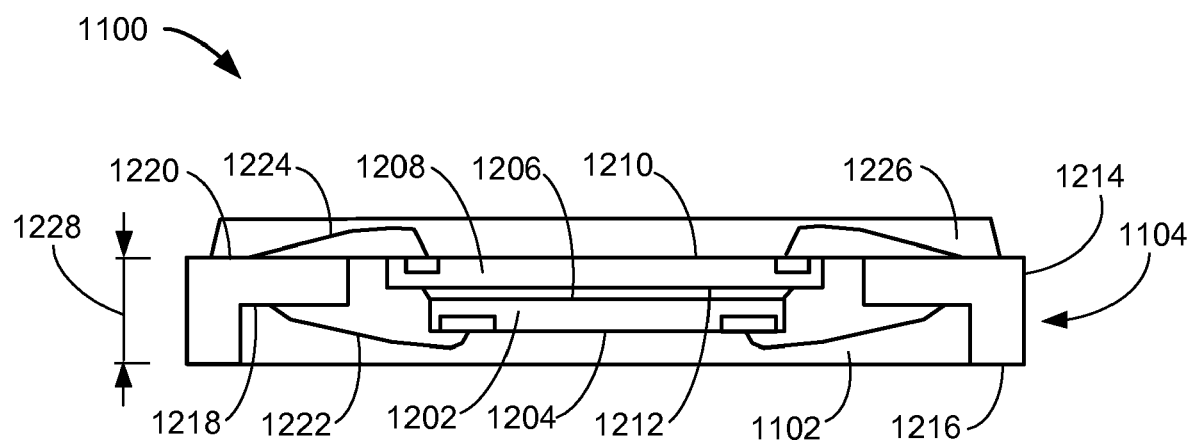
FIG. 12 is a cross-sectional view of the integrated circuit package system of FIG. 11 along line 12-12.

Referring now to FIG. 12, therein is shown a cross-sectional view of the integrated circuit package system 1100 of FIG. 11 along line 12-12. The cross-sectional view depicts an integrated circuit die 1202 having a first active side 1204 and a first passive side 1206. The first active side 1204 has active circuitry fabricated thereon. The first passive side 1206 faces a backside element 1208, such as another integrated circuit die. The backside element 1208 has a second active side 1210 and a second passive side 1212. The integrated circuit die 1202 and the backside element 1208 are attached to each other in a back-to-back configuration with the first passive side 1206 facing the second passive side 1212.

The external interconnects 1104 includes a peripheral side 1214, a first side 1216, a second side 1218, and a third side 1220. The peripheral side 1214 help forms the outermost peripheral border of the integrated circuit package system 1100. The external interconnects 1104 is along the height of the first encapsulation 1102. The first encapsulation 1102 exposes the first side 1216, wherein the first side 1216 is below the second side 1218.

The external interconnects 1104 may be formed by a number of different ways. For example, the second side 1218 may be formed by half-etching from the first side 1216. Another example, the external interconnects 1104 may be formed by stamping or punching the external interconnects 1104 for forming the L-shaped configuration of the external interconnects 1104. The third side 1220 is at an opposing side of the external interconnects 1104 to the first side 1216 and the second side 1218.

First internal interconnects 1222, such as bond wires, ribbon bond wires, reversed-stand-off-stitch bonding (RSSB) or planar electrical interconnects, connect the first active side 1204 and the second side 1218 of a portion of the external interconnects 1104. Second internal interconnects 1224, such as bond wires, ribbon bond wires, reversed-stand-off-stitch bonding (RSSB) or planar electrical interconnects, connect the second active side 1210 and the third side 1220 of a portion of the external interconnects 1104. For illustrative purposes, the first internal interconnects 1222 and the second internal interconnects 1224 are shown connecting the same instances of the external interconnects 1104, although it is understood that the first internal interconnects 1222 and the second internal interconnects 1224 may not connect to the same instances of the external interconnects 1104.

The first encapsulation 1102 covers the integrated circuit die 1202 and the first internal interconnects 1222. The first encapsulation 1102 partially covers the external interconnects 1104 and the backside element 1208. The first encapsulation 1102 is coplanar with the external interconnects 1104 along a plane having the first side 1216. The first encapsulation 1102 exposes the second active side 1210 of the backside element 1208.

A second encapsulation 1226, such as an epoxy mold compound having transparent or translucent properties, is over the first encapsulation 1102 and the external interconnects 1104 covering the second active side 1210 of the backside element 1208 and the second internal interconnects 1224. The second encapsulation 1226 partially covers the third side 1220 with a portion of the third side 1220 that is adjacent to the peripheral side 1214 is exposed.

The second encapsulation 1226 having transparent properties may serve a number of functions. For example, the backside element 1208 may be an image sensor receiving light through the second encapsulation 1226. Another example, the transparent properties of the second encapsulation 1226 may provide an inspection window for the integrated circuit package system 1100, wherein the inspection window may be used for observing identification marks, color changes, or a function of microelectromechanical system (MEMS).

The integrated circuit package system 1100 has a number of features providing a package height 1228 having a low profile, wherein the package height 1228 is similar to or substantially the same as conventional single die packages (not shown). For example, the back-to-back mounting configuration and the dual molded body are examples of these features providing a predetermined low profile for the package height 1228.

The integrated circuit package system 1100 may be formed by a number of different ways to a predetermined height for the package height 1228. For example, the backside element 1208, the integrated circuit die 1202, or a combination thereof may be aggressive thinned. The external interconnects 1104 may be formed to predetermined thickness. Different types of the first internal interconnects 1222 and the second internal interconnects 1224 may be used to provide a predetermined value of the package height 1228.

Figure 13:
FIG. 13 is a perspective view of a wafer in a thinning phase.

Referring now to FIG. 13, therein is shown a perspective view of a wafer 1302 in a thinning phase. The perspective view depicts a back portion 1304 of the wafer 1302. The wafer 1302 undergoes a thinning process from the back portion 1304. The back portion 1304 does not have active circuitry or active elements thereon. The back portion 1304 may be thinned with a number of processes, such as lapping, grinding, or etching.

Figure 14:
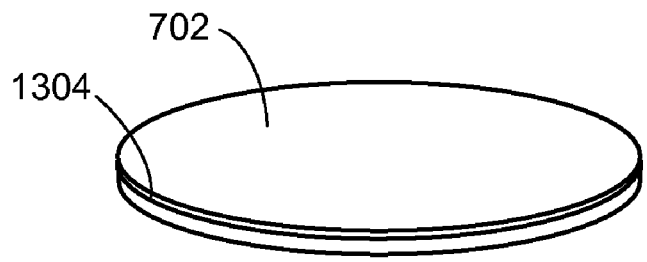
FIG. 14 is the structure of FIG. 13 in a forming phase of a backside element.

Referring now to FIG. 14, therein is shown the structure of FIG. 13 in a forming phase of the backside element 702. The backside element 702, also referred to as a first passive side concealer, may be a number of different materials, such as the plastic layer having cured properties of the encapsulation 704 of FIG. 7, a polymer film, or an silica filled epoxy mold compound.

The backside element 702 may be formed at the back portion 1304 in a number of ways. For example, the backside element 702 may be formed with screen printing and cured epoxy paste. Another example, the polymer film may be formed as a laminated layer. Yet another example, the backside element 702 may be premolded.

Figure 15:
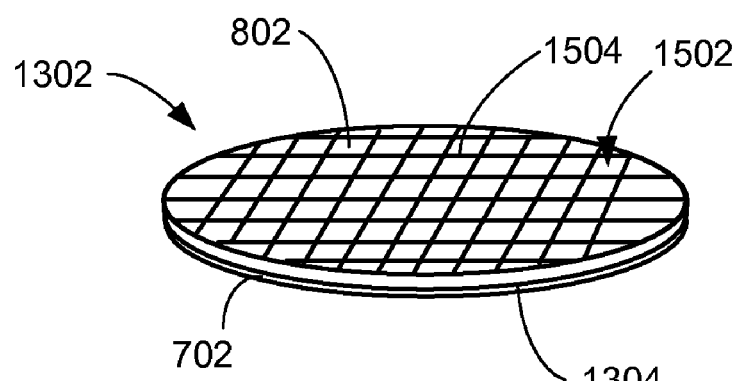
FIG. 15 is the structure of FIG. 14 in a singulating phase of the wafer.

Referring now to FIG. 15, therein is shown the structure of FIG. 14 in a singulating phase of the wafer 1302. The wafer 1302 is in a vertically flipped orientation to that shown in FIG. 14 displaying an active portion 1502 of the wafer 1302. The active portion 1502 is on an opposing side of the back portion 1304 of FIG. 14. The active portion 1502 includes active circuitry or active elements fabricated thereon.

The backside element 702 does not cover the active portion 1502. The wafer 1302 undergoes singulation depicted by singulation lines 1504. The portion of the wafer 1302 within the singulation lines 1504 is the integrated circuit die 802.

Figure 16:
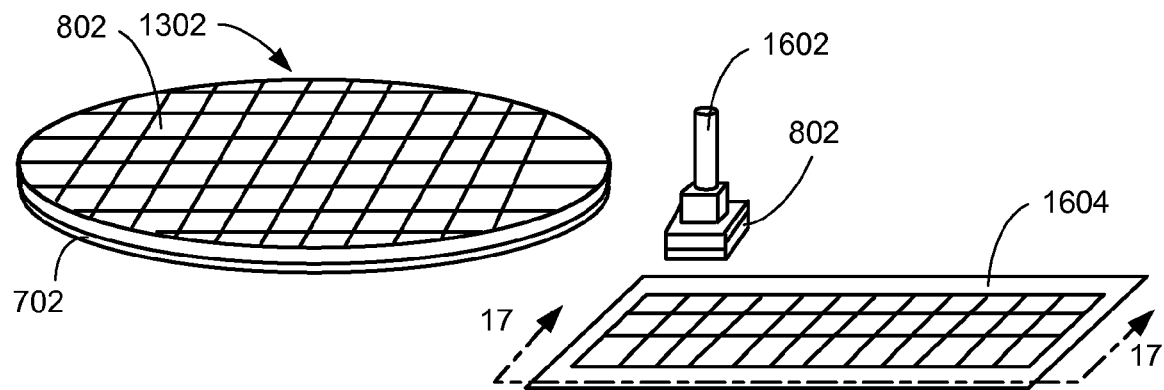
FIG. 16 is the structure of FIG. 15 in a separating phase of the integrated circuit die.

Referring now to FIG. 16, therein is shown the structure of FIG. 15 in a separating phase of the integrated circuit die 802. A removal apparatus 1602, such as a pick and place mechanism, removes the integrated circuit die 802 from the wafer 1302 and moves the integrated circuit die 802 to a lead frame 1604. The integrated circuit die 802 also has the backside element 702.

Figure 17:
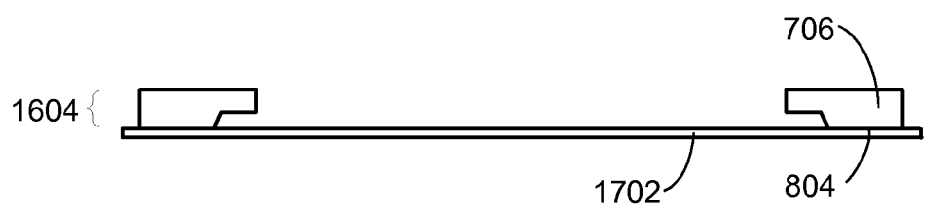
FIG. 17 is a cross-sectional view of the lead frame of FIG. 16 along line 17-17.

Referring now to FIG. 17, therein is shown a cross-sectional view of the lead frame 1604 of FIG. 16 along line 17-17. The lead frame 1604 having the external interconnects 706 is on a tape 1702, such as a coverlay tape. The tape 1702 attaches to the first side 804 of the external interconnects 706 and provides a planar surface between the first side 804 of the external interconnects 706 and the space between the external interconnects 706.

Figure 18:
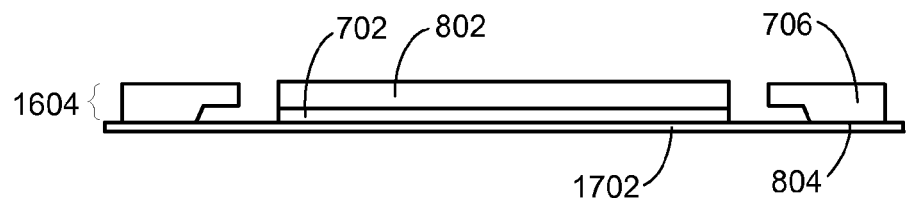
FIG. 18 is the structure of FIG. 17 in an attaching phase the integrated circuit die having the backside element.

Referring now to FIG. 18, therein is shown the structure of FIG. 17 in an attaching phase the integrated circuit die 802 having the backside element 702. The integrated circuit die 802 mounts on the tape 1702 with the backside element 702 substantially coplanar with the first side 804 of the external interconnects 706. The backside element 702 is not formed as an integral portion to the lead frame 1604 of FIG. 17.

Figure 19:
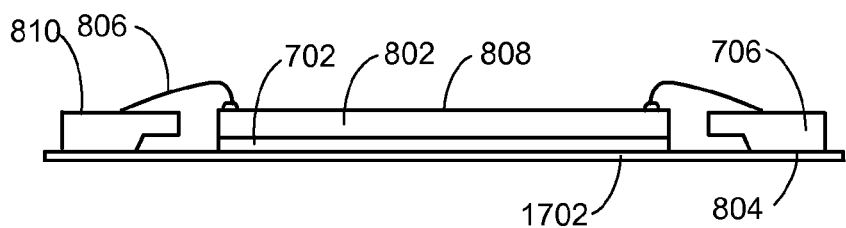
FIG. 19 is the structure of FIG. 18 in a connecting phase of the internal interconnect.

Referring now to FIG. 19, therein is shown the structure of FIG. 18 in a connecting phase of the internal interconnects 806. The internal interconnects 806 connect the first active side 808 of the integrated circuit die 802 and the second side 810 of the external interconnects 706. The tape 1702 secures the backside element 702 to be coplanar with the first side 804 of the external interconnects 706.

Figure 20:
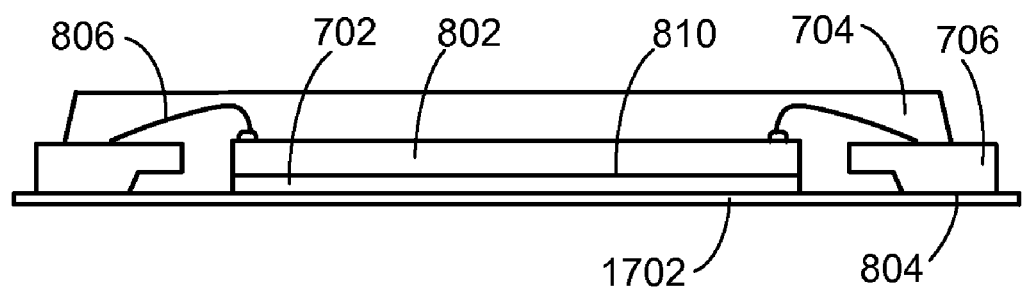
FIG. 20 is the structure of FIG. 19 in a forming phase of the encapsulation.

Referring now to FIG. 20, therein is shown the structure of FIG. 19 in a forming phase of the encapsulation 704. The encapsulation 704 is formed covering the integrated circuit die 802 and the internal interconnects 806. The encapsulation 704 partially covers the second side 810 of the external interconnects 706. The tape 1702 prevents the encapsulation 704 from covering the first side 804 of the external interconnects 706 and the horizontal portion of the backside element 702 not attached to the integrated circuit die 802. The encapsulation 704 may be formed in a number of ways, such as injection molding with a mold cap (not shown) over the integrated circuit die 802, the internal interconnects 806, and the external interconnects 706.

Figure 21:
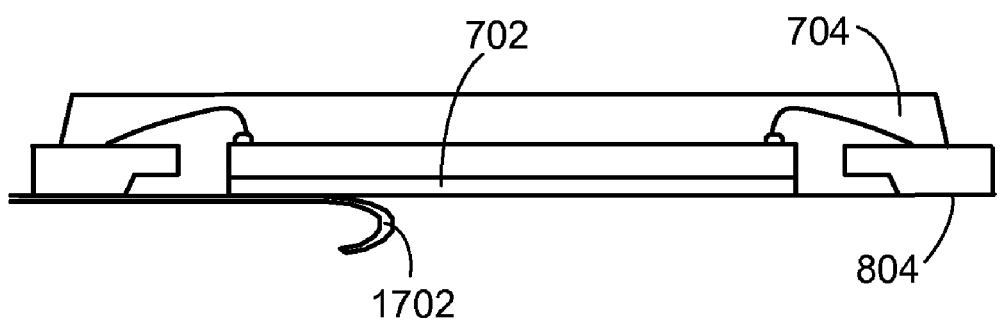
FIG. 21 is the structure of FIG. 20 in a removing phase of the tape.

Referring now to FIG. 21, therein is shown the structure of FIG. 20 in a removing phase of the tape 1702. The encapsulation 704 may be hardened or cured. The tape 1702 is shown being removed exposing the backside element 702 and the first side 804. The backside element 702 and the first side 804 are coplanar with the encapsulation 704 along the plane having the first side 804.

Figure 22:
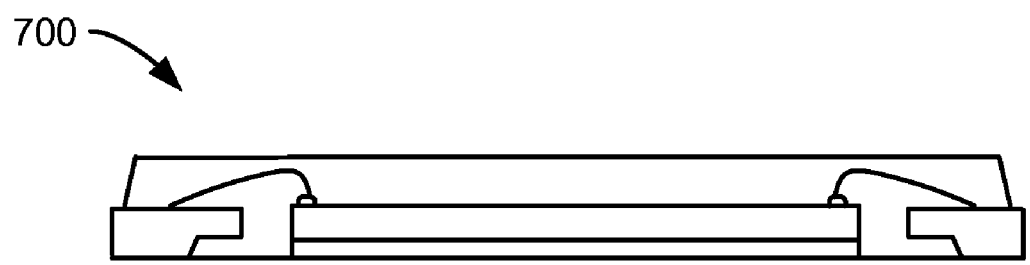
FIG. 22 is the structure of FIG. 21 in a singulating phase of the integrated circuit package system of FIG. 8.

Referring now to FIG. 22, therein is shown the structure of FIG. 21 in a singulating phase of the integrated circuit package system 700 of FIG. 8. The structure of FIG. 21 may undergo cleaning. The lead frame 1604 of FIG. 16 is singulated forming the integrated circuit package system 700.

Figure 23:
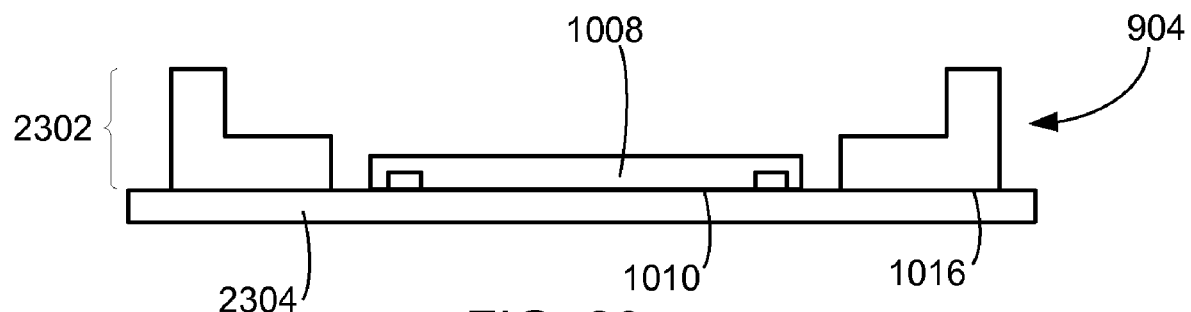
FIG. 23 is a cross-sectional view of the integrated circuit package system of FIG. 9 in an attaching phase of the backside element.

Referring now to FIG. 23, therein is shown a cross-sectional view of the integrated circuit package system 900 of FIG. 9 in an attaching phase of the backside element 1008. A lead frame 2302 having the external interconnects 904 is on a tape 2304, such as a coverlay tape.

Each of the external interconnects 904 are shown preferably formed as an integral structure, such as formed from the lead frame 2302. The tape 2304 attaches to the first side 1016 of the external interconnects 904 and provides a planar surface between the first side 1016 of the external interconnects 904 and the space between the external interconnects 904.

The external interconnects 904 are shown in a vertically flipped orientation compared to FIG. 10. The second active side 1010 of the backside element 1008, such as an integrated circuit die, attaches to the tape 2304. The backside element 1008 is not formed as an integral portion to the lead frame 2302. The tape 2304 secures the first side 1016 of the external interconnects 904 coplanar with the second active side 1010.

Figure 24:
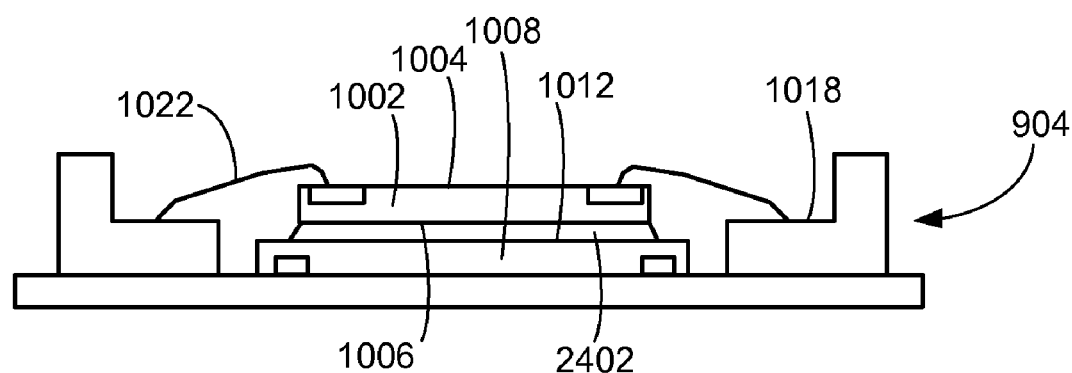
FIG. 24 is the structure of FIG. 23 in a connecting phase of the integrated circuit die.

Referring now to FIG. 24, therein is shown the structure of FIG. 23 in a connecting phase of the integrated circuit die 1002. The first passive side 1006 of the integrated circuit die 1002 attaches to the second passive side 1012 of the backside element 1008 with an adhesive 2402, such as a die-attach adhesive. The first internal interconnects 1022 connect the first active side 1004 and the second side 1018 of the external interconnects 904. The backside element 1008, the integrated circuit die 1002, and the first internal interconnects 1022 are between the external interconnects 904.

Figure 25:
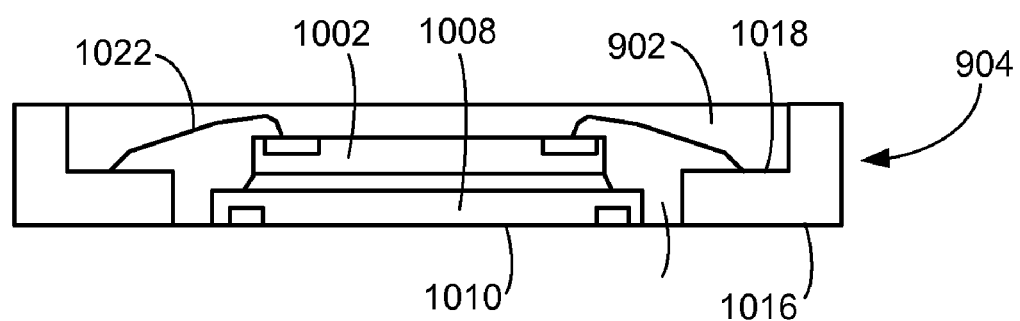
FIG. 25 is the structure of FIG. 24 in a forming phase of the first encapsulation.

Referring now to FIG. 25, therein is shown the structure of FIG. 24 in a forming phase of the first encapsulation 902. The first encapsulation 902 is formed covering the integrated circuit die 1002 and the first internal interconnects 1022. The first encapsulation 902 partially covers the second side 1018 of the external interconnects 904. The tape 2304 of FIG. 23 prevents the first encapsulation 902 from covering the first side 1016 of the external interconnects 904 and the second active side 1010 of the backside element 1008. The tape 2304 is removed with the first encapsulation 902 formed.

The first encapsulation 902 may be formed in a number of ways, such as injection molding in a mold chase (not shown) over the integrated circuit die 1002, the first internal interconnects 1022, and the external interconnects 904. The first encapsulation 902 may be hardened or cured. The tape 2304 is removed exposing the second active side 1010 of the backside element 1008 and the first side 1016. The backside element 1008 and the first side 1016 are coplanar with an encapsulation 2504 along the plane having the first side 1016.

Figure 26:
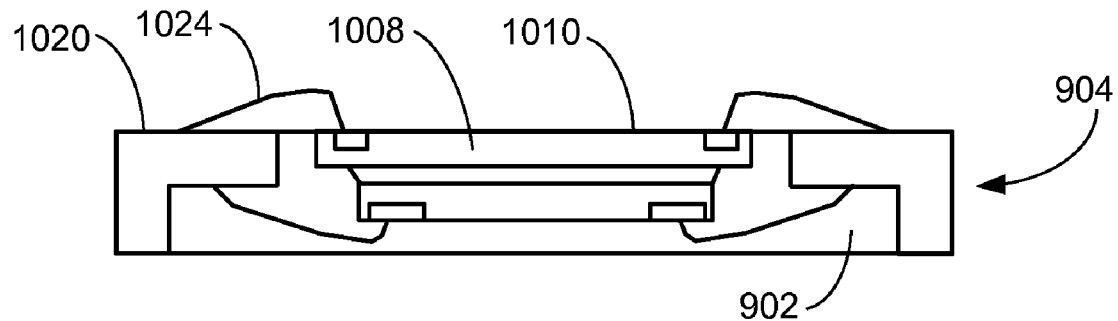
FIG. 26 is the structure of FIG. 25 in a connecting phase of the backside element.

Referring now to FIG. 26, therein is shown the structure of FIG. 25 in a connecting phase of the backside element 1008. The structure of FIG. 25 is vertically flipped. The second internal interconnects 1024 connect the second active side 1010 exposed from the first encapsulation 902 and the third side 1020 of the external interconnects 904.

Figure 27:
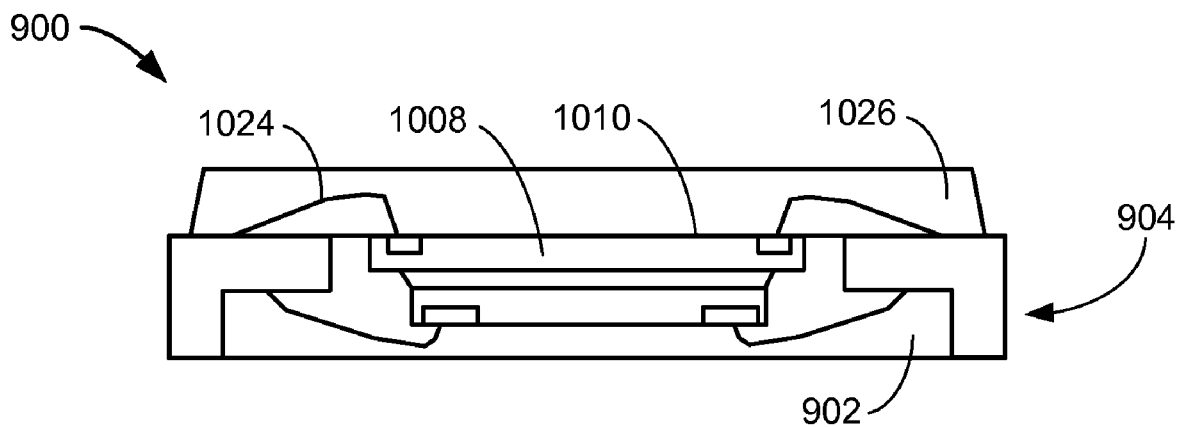
FIG. 27 is the structure of FIG. 26 in a forming phase of the second encapsulation.

Referring now to FIG. 27, therein is shown the structure of FIG. 26 in a forming phase of the second encapsulation 1026. The second encapsulation 1026 is formed over the external interconnects 904, the second internal interconnects 1024, the backside element 1008, and the first encapsulation 902. The second encapsulation 1026 may be formed by a number of ways, such as injection molding with a mold cap (not shown) over the second internal interconnects 1024 and the second active side 1010.

The second encapsulation 1026 is cured and the lead frame 2302 of FIG. 23 is singulated forming the integrated circuit package system 900. The first encapsulation 902 and the second encapsulation 1026 form a dual molded body of the integrated circuit package system 900.

Figure 28:
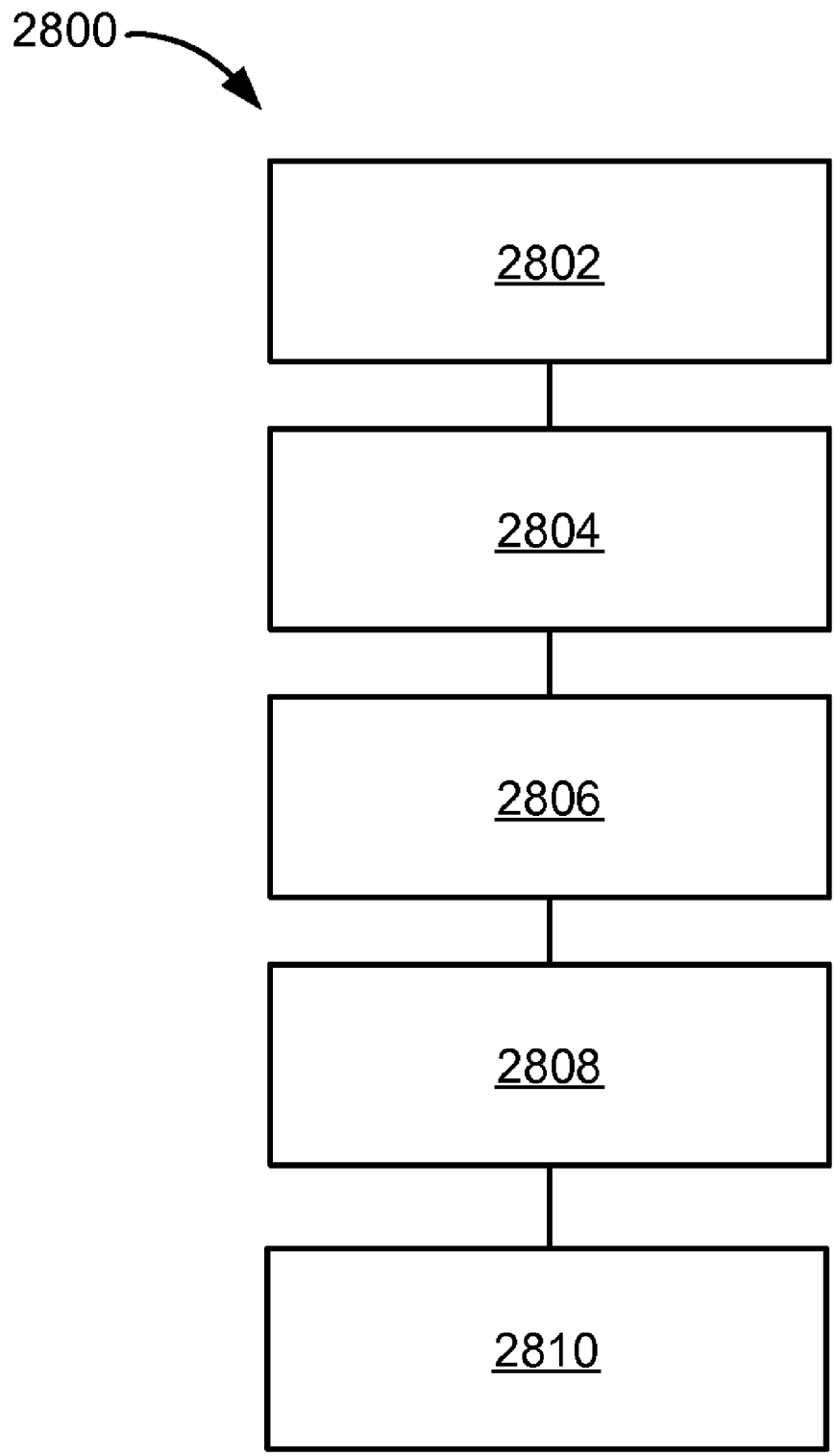
FIG. 28 is a flow chart of an integrated package system for manufacturing the integrated circuit package system in an embodiment of the present invention.

Referring now to FIG. 28, therein is shown a flow chart of an integrated circuit package system 2800 for manufacturing the integrated circuit package system 100 in an embodiment of the present invention. The system 2800 includes attaching an external interconnect on a tape in a block 2802; attaching a backside element on the tape adjacent to the external interconnect in a block 2804; attaching an integrated circuit die with the backside element, the backside element is on a first passive side of the integrated circuit die in a block 2806; connecting a first active side of the integrated circuit die and the external interconnect in a block 2808; and forming a first encapsulation over the integrated circuit die with the backside element exposed in a block 2810.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
an external interconnect;
a backside element isolated from the external interconnect and coplanar to a first side of the external interconnect, the backside element has a different material than the external interconnect;
an integrated circuit die over the backside element with a first passive side of the integrated circuit die facing backside element;
a first internal interconnect between a first active side of the integrated circuit die and the external interconnect; and
a first encapsulation over the integrated circuit die and surrounding the backside element, with a portion of the backside element and the first side exposed.

2. The system as claimed in claim 1 wherein the backside element includes a plastic, a polymer, or an epoxy molding compound.

3. The system as claimed in claim 1 further comprising a ring between the external interconnect and integrated circuit die, wherein the integrated circuit die and the ring connected with the first internal interconnect.

4. The system as claimed in claim 1 further comprising a peripheral side of the external interconnect exposed from the first encapsulation.

5. The system as claimed in claim 1 wherein the integrated circuit die is not coplanar with the external interconnect.

6. The system as claimed in claim 5 further comprising:
a second side of the external interconnect opposite the first side; and
a third side of the external interconnect opposite the first side and not coplanar with the second side.

7. The system as claimed in claim 5 wherein:
the backside element is another integrated circuit die having a second passive side and a second active side with active circuitry thereon;
the external interconnect includes:
a second side above the first side, and
a third side at an opposing side of the external interconnect to first side and the second side,
the first internal interconnect is between the first active side and the second side;
the first encapsulation over the integrated circuit die with the backside element exposed has the second active side exposed;
further comprising:
a second internal interconnect between the second active side and the third side; and
a second encapsulation over the second active side.

8. The system as claimed in claim 5 further comprising a second encapsulation over the backside element wherein the second encapsulation is transparent.

9. The system as claimed in claim 5 wherein the backside element is a sensor integrated circuit die.

10. The system as claimed in claim 1 wherein:
the backside element is another integrated circuit die having a second active side with active circuitry thereon;
the first encapsulation exposes the second active side; and
further comprising:
a second encapsulation over the second active side.

11. A method for manufacturing an integrated circuit package system comprising:
attaching an external interconnect on a tape;
attaching a backside element on the tape and isolated from the external interconnect. the backside element coplanar with a first side of the external interconnect;
attaching an integrated circuit die with the backside element, the backside element is on a first passive side of the integrated circuit die;
connecting a first active side of the integrated circuit die and the external interconnect; and
forming a first encapsulation over the integrated circuit die and surrounding the backside element, with a portion of the backside element exposed;

Wherein the backside element has a different material than the external interconnect.

12. The method as claimed in claim 1 wherein attaching the backside element on the tape includes attaching the integrated circuit die having the backside element on the first passive side to the tape.

13. The method as claimed in claim 1 wherein:
attaching the backside element includes:
providing another integrated circuit die having a second active side with active circuitry thereon;
forming the first encapsulation further includes:
exposing the second active side; and
further comprising:
forming a second encapsulation over the second active side.

14. The method as claimed in claim 1 further comprising:
forming a ring between the external interconnect and integrated circuit die; and
connecting the ring and the integrated circuit die.

15. The method as claimed in claim 1 wherein forming the first encapsulation includes exposing a peripheral side of the external interconnect.

16. A method of manufacturing an integrated circuit package system comprising:
attaching a lead frame having an external interconnect on a tape;
attaching a backside element on the tape and isolated from the external interconnect, the backside element coplanar with a first side of the external interconnect and not integral to the lead frame;
attaching an integrated circuit die with the backside element, the backside element is on a first passive side of the integrated circuit die;
connecting a first active side of the integrated circuit die and the external interconnect; and
forming a first encapsulation over the integrated circuit die and surrounding the backside element, with the first encapsulation exposing the first side of the external interconnect and a portion of the backside element;
Wherein the backside element has a different material than the external interconnect.

17. The method as claimed in claim 16 further comprising half-etching the external interconnect from a side opposite the first side.

18. The method as claimed in claim 16 wherein:
attaching the backside element on the tape includes:
providing another integrated circuit die having a second passive side and a second active side with active circuitry thereon;
attaching the second active side on the tape;
connecting the first active side of the integrated circuit die and the external interconnect also includes:
connecting the first active side and a second side of the external interconnect, the second side is a half-etched portion from the first side;
forming the first encapsulation over the integrated circuit die with the backside element exposed further includes:
exposing the second active side with the first encapsulation;
further comprising:
connecting the second active side of the backside element and a third side of the external interconnect opposite the second side; and
forming a second encapsulation over the second active side.

19. The method as claimed in claim 16 further comprising removing the tape.

20. The method as claimed in claim 16 further comprising singulating the lead frame.

* * * * *

UNITED STATES PATENT AND TRADEMARK OFFICE
CERTIFICATE OF CORRECTION

PATENT NO. : 8,115,305 B2  
APPLICATION NO. : 11/750218  
DATED : February 14, 2012  
INVENTOR(S) : Camacho et al.

Page 1 of 1

It is certified that error appears in the above-identified patent and that said Letters Patent is hereby corrected as shown below:

In the Claims:

1. Column 15, claim 12, line 3, delete "claim 1" and insert therefor -- claim 11 --

2. Column 15, claim 13, line 7, delete "claim 1" and insert therefor -- claim 11 --

3. Column 15, claim 14, line 16, delete "claim 1" and insert therefor -- claim 11 --

4. Column 15, claim 15, line 20, delete "claim 1" and insert therefor -- claim 11 --

Signed and Sealed this
Twenty-first Day of April, 2015

Michelle K. Lee
*Director of the United States Patent and Trademark Office*